(12) United States Patent
Hebert et al.

(10) Patent No.: US 10,003,013 B2
(45) Date of Patent: Jun. 19, 2018

(54) SEMICONDUCTOR DEVICE HAVING CIRCUITRY POSITIONED ABOVE A BURIED MAGNETIC SENSOR

(71) Applicant: Magnachip Semiconductor, Ltd., Cheongju-si (KR)

(72) Inventors: Francois Hebert, San Mateo, CA (US); Seong Woo Lee, Cheongju-si (KR); Jong Yeul Jeong, Cheongju-si (KR); Hee Baeg An, Cheongju-si (KR); Kang Sup Shin, Cheongju-si (KR); Seong Min Choe, Seongnam-si (KR); Young Joon Kim, Seoul (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 204 days.

(21) Appl. No.: 14/471,678

(22) Filed: Aug. 28, 2014

(65) Prior Publication Data
US 2015/0255709 A1    Sep. 10, 2015

(30) Foreign Application Priority Data

Mar. 6, 2014 (KR) .................... 10-2014-0026765

(51) Int. Cl.
*G01R 33/07* (2006.01)
*H01L 43/06* (2006.01)

(52) U.S. Cl.
CPC .......... *H01L 43/065* (2013.01); *G01R 33/072* (2013.01)

(58) Field of Classification Search
CPC .................. G01R 33/072; H01L 43/065

USPC .................................... 324/252, 251
See application file for complete search history.

(56) References Cited

U.S. PATENT DOCUMENTS

| 4,607,271 A * | 8/1986 | Popovic | H01L 29/82 257/288 |
| 4,700,211 A * | 10/1987 | Popovic | G01R 33/06 257/423 |
| 4,929,993 A * | 5/1990 | Popovic | H01L 27/22 257/424 |
| 4,965,517 A | 10/1990 | Shelton et al. | |
| 5,438,990 A * | 8/1995 | Wahlstrand | H01L 27/22 257/E27.005 |
| 5,530,345 A * | 6/1996 | Murari | H01L 43/065 257/426 |
| 6,873,170 B2 * | 3/2005 | Asam | G01R 31/2856 257/467 |
| 7,250,760 B2 * | 7/2007 | Ao | G01D 5/145 324/252 |
| 7,253,490 B2 * | 8/2007 | Oohira | G01R 33/07 257/424 |

(Continued)

FOREIGN PATENT DOCUMENTS

| DE | 102006028520 B4 * | 4/2009 | ........... G01R 15/202 |
| DE | 102011002580 A1 * | 7/2012 | ............. G01R 33/07 |

*Primary Examiner* — Jay Patidar
(74) *Attorney, Agent, or Firm* — NSIP Law (57) ABSTRACT

A semiconductor device including a circuitry, a magnetic sensor, and a buried oxide. The circuitry is formed on a substrate. The magnetic sensor has a sensing area formed under the circuitry. The buried oxide is disposed between the circuitry and the magnetic sensor. The sensing are comprises an N-doped area and a P-doped area doped deeper than the N-doped area, and sensor contacts connect the sensing area with the circuitry through the buried oxide.

13 Claims, 5 Drawing Sheets

(56) References Cited

U.S. PATENT DOCUMENTS

| | | | | |
|---|---|---|---|---|
| 9,024,632 B2* | 5/2015 | Furuichi | .................. | H01L 43/12 |
| | | | | 324/252 |
| 9,030,199 B2* | 5/2015 | Liou | ...................... | B82Y 25/00 |
| | | | | 29/846 |
| 2005/0230770 A1* | 10/2005 | Oohira | ................... | G01R 33/07 |
| | | | | 257/421 |
| 2010/0219810 A1* | 9/2010 | Rocznik | ................. | G01R 33/07 |
| | | | | 324/207.2 |
| 2010/0219821 A1* | 9/2010 | Rocznik | ................. | G01R 33/07 |
| | | | | 324/251 |
| 2014/0367813 A1* | 12/2014 | Ryu | ....................... | H01L 43/04 |
| | | | | 257/421 |

* cited by examiner

SEMICONDUCTOR DEVICE HAVING CIRCUITRY POSITIONED ABOVE A BURIED MAGNETIC SENSOR

CROSS-REFERENCE TO RELATED APPLICATIONS

This application claims the benefit under 35 U.S.C. § 119(a) of Korean Patent Application No. 10-2014-0026765 filed on Mar. 6, 2014, in the Korean Intellectual Property Office, the entire disclosure of which is incorporated herein by reference for all purposes.

BACKGROUND

1. Field

The following description relates to a semiconductor device having a buried magnetic sensor. The following description also relates to a magnetic field sensor or Hall device that is formed in buried form inside of a semiconductor substrate, wherein in a top portion of the magnetic field sensor or Hall device, analog and digital circuitry is positioned with respect to the sensor, and a related magnetic sensor or Hall sensor provide certain features.

2. Description of Related Art

A magnetic field sensing device, or Hall device, is a device that identifies a direction and a magnitude of magnetic field by use of a Hall effect. Throughout the following description, it is understood that a magnetic field sensing device and a Hall device both refer to such a device, and hence such a device is referred to only as "a magnetic field sensing device." Likewise, as used herein, it is understood that a magnetic sensor or a Hall sensor is a sensor that senses such information in the context of a magnetic field sensing device or Hall device, and hence such a sensor is referred to only as a "magnetic sensor." According to the Hall effect, a voltage is generated in a perpendicular direction to a magnetic field and a current when applying the magnetic field to a conductor in which a current flows. That is, the magnetic field sensing device is characterized in that two electrodes facing each other among four electrodes provide a current flow under such a circumstance that the magnetic field is applied, and that the other two electrodes facing each other provide a Hall voltage that is generated in a vertical direction with the current flow and that a Hall voltage is thus detected to determine a direction and a magnitude of the magnetic field.

Such a magnetic field sensing device is applied in a magnetic sensor such as a Digital Compass or an eCompass that provides direction data by detecting the magnetic field of the earth.

Such a magnetic sensor or provides a function that the cardinal bearing directions of north and south and east and west on the earth can be acquired by applying the Hall effect of the magnetic field sensing device with respect to the magnetic field of the earth. For example, such a magnetic sensor may be used in a portable digital apparatus such as a smartphones, by being mounted to or embedded in the smartphone. When used in combination with a portable digital apparatus, by use of a mobile application, information from such a magnetic sensor is employed with respect to a map application. For example, information from the magnetic sensor may be useful for purposes not only of obtaining a bearing of the earth, but of utilizing location data.

In the magnetic sensor, analog circuitry and digital circuitry may be used together, in order to process the detected results of the magnetic field sensing device. The analog and digital circuitry refers to various types of circuits to process the signal detected by the magnetic field sensing device. For example, the circuitry may include elements such as a low noise amplifier (LNA), an automatic gain controller (AGC), an analog-digital converter (ADC), a main controller, and other electronic elements, by way of example.

As stated above, the magnetic sensor is used along with the analog and digital circuitry. To date, the analog and digital circuitry has usually been designed to be situated in a horizontal direction with respect to the magnetic field sensing device. For example, a magnetic field sensing device is formed, and analog and digital circuitry is positioned in a lateral direction of the magnetic field sensing device. Additionally, between the magnetic field sensing device and the circuits, an insulating layer or the like may be further formed, and a variety of structures for insulation between circuits may also be provided.

Consequently, these approaches present an issue that the size of the magnetic sensor itself is not able to be reduced. This issue results in a further issue that the total size of the IC chip that constitutes the magnetic sensor is not able to be reduced either.

The above-mentioned issues lead to difficulties in efforts in for making the size of variety of portable digital apparatuses smaller. That is, unless the size of magnetic field sensing device and of its related circuits are reduced themselves, as discussed above, it is difficult to reduce the size of portable digital apparatuses due to the designated positions of magnetic field sensing device and analog/digital circuits consuming a large amount of space. Furthermore, if the size of magnetic field sensing device is reduced, the sensitivity of the device regarding the earth's magnetic field or magnetic force is also decreased. Thus, it is difficult to reduce the sensitivity of the device more than a certain level.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present examples address the above-mentioned issues. The examples provide a magnetic field sensing device in which, to minimize an area of the magnetic sensor as much as possible, a magnetic sensor is buried in a semiconductor substrate using a silicon on insulator (SOI) substrate. Circuit structures of analog and digital devices are positioned at a top portion of the magnetic field sensing device, and a corresponding magnetic sensor thereof.

The magnetic sensor is situated in a semiconductor substrate. By positioning all sorts of circuits at an upper location, between a magnetic sensor and an intermetal dielectric, outside influences are further minimized.

In one general aspect, a semiconductor device may comprise a circuitry and a buried magnetic sensor which is under the circuitry.

The semiconductor device may include a silicon on insulator (SOI) substrate including a semiconductor substrate, a buried oxide (BOX) layer, and an SOI layer.

The buried magnetic sensor may comprise a sensing area formed in the semiconductor substrate, a sensor contact that passes through the buried oxide and is connected with the sensing area, and the circuitry formed on the SOI layer.

The sensing area may include an N-doped area, and a P-doped area doped deeper than the N-doped area.

The sensor contact may pass through the SOI layer and the BOX layer.

The sensor contact may be connected by a wire with the circuitry.

A length of the P-doped area may be the same as or longer than a length of the N-doped area.

The semiconductor device having a buried magnetic sensor may further include an isolation area formed around the sensor contact.

The semiconductor device having a buried magnetic sensor may further include an intermetal dielectric formed on the SOI layer, and an integrated magnetic concentrator (IMC) formed on the intermetal dielectric.

The IMC may include a curved or non-planar surface.

The IMC may be in contact with the intermetal dielectric and in contact with the buried oxide.

In another general aspect, a semiconductor device may include a circuitry formed on a semiconductor substrate with an epitaxial layer on top to the substrate The semiconductor device may further include a magnetic sensor having a sensing area formed under the circuitry, wherein the magnetic sensor includes a sensing area formed in the semiconductor substrate.

The semiconductor device may further include a sensor contact connected to the sensing area, wherein the sensing area comprises an N-doped area and a P-doped area doped deeper than the N-doped area.

The semiconductor device may further include an intermetal dielectric formed on the sensor contact, and an integrated magnetic concentrator (IMC) formed on the intermetal dielectric.

A deep trench isolation (DTI) may be formed around the sensor contact.

In another general aspect, a semiconductor device may include a circuitry formed on a substrate and a buried magnetic sensor having a sensing area formed under the circuitry.

The magnetic sensor includes a sensing area, wherein the sensing area comprises an N-doped area and a P-doped area doped deeper than the N-doped area, and sensor contacts connected with the sensing area connected with circuitry by a wire.

Some of the sensor contacts may detect a voltage change due to a Hall effect and the other sensor contacts may detect a corresponding amount of current.

The substrate may be a silicon on insulator (SOI) substrate comprising a semiconductor substrate, a buried oxide, and an SOI layer. The substrate may be a standard substrate with epitaxial grown silicon on top to the substrate.

The circuitry may be analog-digital circuitry.

One of the sensor contacts may act as a ground.

The N-doped area may include an area of a high concentration of dopant and the N-doped area may be connected to the circuitry at the area of a high concentration of dopant.

Current may flow through the N-doped area and the P-doped area may act as a barrier that guides how current flows through the N-doped area.

The semiconductor device may further include an intermetal dielectric formed on the sensor contacts, and an integrated magnetic concentrator (IMC) formed on the intermetal dielectric.

The semiconductor device having a buried Magnetic Sensor with the above-explained structure provides the following effects and features.

First, the present disclosure provides effect of making the size of magnetic sensor smaller than conventional one, forming sensing element under the analog and digital circuitry thereby not using up any "real estate" on the top surface for the sensing element.

Further, the present disclosure provides a narrow current passage that is parallel to a surface of the semiconductor substrate by forming a P-top portion doped area and a P-bottom portion doped area in the N-doped area of the semiconductor substrate. Hence, it is possible to prevent or minimize a current diffusion. A sensitivity of detecting a current is thus improved. Additionally, by having a N-type sensing layer sandwiched between two P-type regions, the sensing area can be placed away from oxide/silicon or surface interfaces in order to improve sensitivity of the sensing element and eliminate interface related problems.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In view of the above issues, it is beneficial to improve a structure of semiconductor device that not only secures an area of magnetic sensor, but that also detects a magnetic field through an alteration of positions regarding the magnetic sensor and all sorts of appropriate processing circuits.

Disclosed herein are structures of a semiconductor device and a magnetic sensor. The semiconductor device constitutes a magnetic sensor based on a wide variety of structures. That is, a magnetic field sensing device is formed based on elements and structures including: a substrate structure of a Silicon on insulator (SOI), an integrated magnetic concentrator (IMC), a structure in which an Epi Layer, an N-buried layer (NBL) and a Deep Trench Isolation (DTI) are used together, and structures in which there are an Epi Layer (Epi), an N-buried layer (NBL) and an integrated magnetic concentrator (IMC) together. The analog/digital circuitry is positioned at a top portion of the semiconductor device that includes a magnetic sensor.

A sensor active area is buried below the die surface (silicon or other materials). Active and passive devices such as logic, Analog, Power, Mixed-Signal, I/Os, Memory, DSP, processor, etc, formed on top of the sensor. One or more sensors including magnetic sensor may be added. Magnetic sensor is a hall sensor. Doping profile of the sensor can be optimized without impacting circuitry. Respective structures of the above are discussed further, below.

Figure 1A:
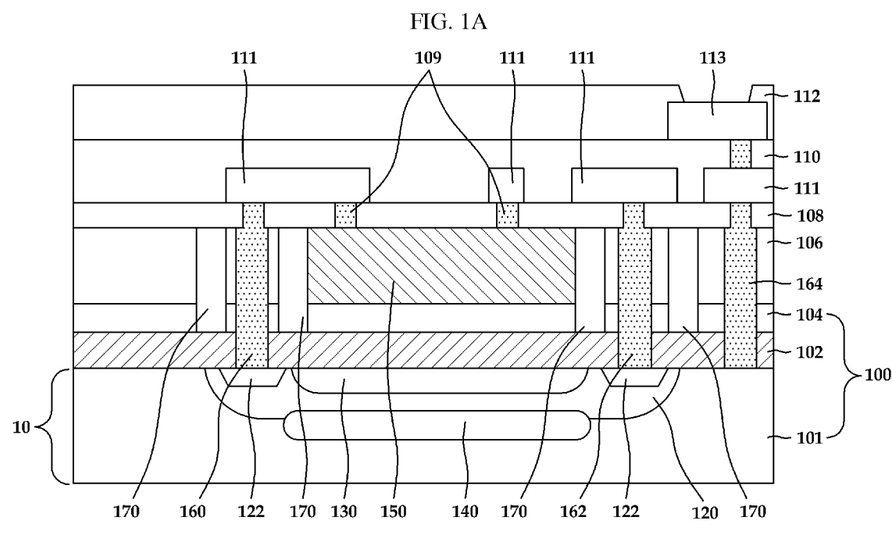
FIG. 1A depicts a cross-sectional view of a semiconductor device having a magnetic sensor in accordance with an example.

FIG. 1A depicts a cross-sectional view of a semiconductor device comprising a magnetic sensor in accordance with a first example.

A semiconductor device in the first example is a structure based on an SOI substrate using a thick SOI layer. The SOI substrate refers to a substrate in which a buried oxide with a certain thickness is laminated by a sandwich structure between a handle wafer and a SOI layer for a device. Such a SOI substrate has an advantage that a complete separation of the device is achievable. FIG. 1A shows a case where a magnetic sensor 10 is formed under the circuitry. The magnetic sensor 10 is also formed under the BOX layer 102.

As shown in FIG. 1A, the example of FIG. 1A includes an SOI substrate 100. The SOI substrate 100 includes a P-type mono-crystalline silicon 101, hereinafter, referred to as "Handle wafer", a buried oxide 102 having a certain thickness on the Handle wafer 101, and an SOI layer 104 formed of another different mono-crystalline silicon on the buried oxide 102. In the present example, the buried oxide 102 has a thickness of 0.1 µm to 1 µm. Preferably, the thickness of the buried oxide 102 is 0.4 µm. Additionally, in the present example, the SOI layer 104 has a thickness of 0.1 µm to 0.5 µm.

Here, on the SOI layer 104, a Si-Epitaxial Layer 106 is further situated. Here a Si-Epitaxial Layer 106 refers to a crystalline overlayer of silicon that is deposited on a crystalline substrate. That is, the Si-Epitaxial Layer is additionally formed on top of the SOI layer. The thick SOI layer is formed so as to be an appropriate substrate for the Si-Epitaxial Layer. The example includes the formation of such an Si-Epitaxial Layer 106.

On a top surface of the Si-Epitaxial Layer 106, an inter layer dielectric (ILD) 108, an intermetal dielectric (IMD) layer 110, and a passivation layer 112 are formed as an dielectric in regular sequence. An dielectric is electrically insulating material between the layers of electrical conductors in an integrated circuit.

Figure 1B:
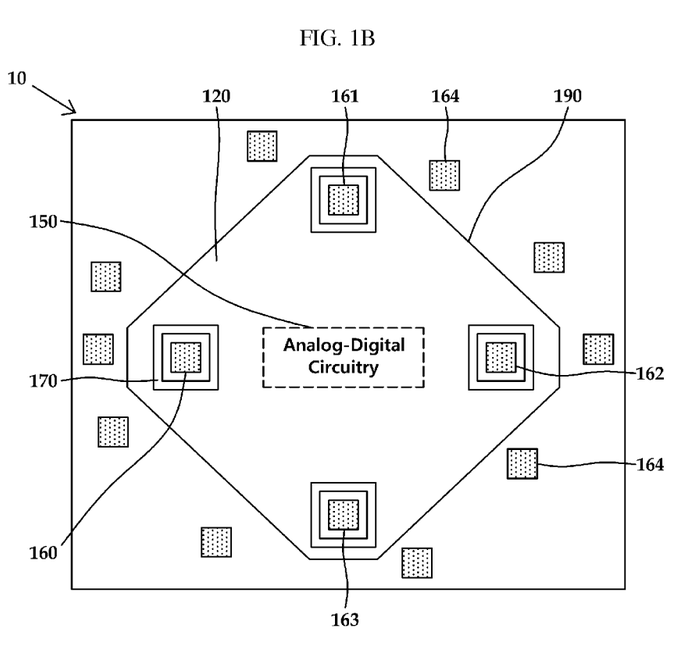
FIG. 1B depicts a plan view of a semiconductor device having a magnetic sensor in accordance with an example.

The magnetic sensor 10 is formed in the handle Wafer 101 among SOI substrate 100. The magnetic sensor 10 basically uses an allocated sensing area 190 to sense the magnetic field, as shown in FIG. 1B. Accordingly, in the magnetic sensor, a current passage region is to be formed where a current flow between two electrodes and the voltage developed is sensed at two other electrodes. To this end, on a surface of the handle wafer 101 in the sensing area 190, an N-doped area where an N-ion is implanted through the buried oxide and thin SOI for the current pass, or in other words an N-conduction layer 120, is formed. Such an N-conduction layer 120 is formed located at a certain depth from the surface of the handle wafer 101.

In an N-conduction layer 120 in the sensing area 190, an N-doped area of a high concentration 122 of dopant is formed for a connection with analog-digital circuitry. Doping refers to intentionally introduced impurities into an extremely pure semiconductor to change its electrical properties, and the dopant and the concentration of the dopant are chosen here so as to be suitable to facilitate circuit connection. The Ohmic contacts to N-region 120 are formed by N+ ion implantation through contacts 160 and 162.

As discussed above, the magnetic sensor according to the present example is formed in the Handle wafer 101 that is part of the SOI substrate 100.

Additionally, in the Handle wafer 101 in which a magnetic sensor is formed, a P-top portion doped area 130 and a P-bottom doped area 140 as an optional layers in the example of FIG. 1A are further formed at top and bottom portions of the N-conduction layer 120. Here, the P-top doped area 130 is situated at a certain depth below a top surface of the Handle wafer 101, and is formed by being doped as a shallower layer than the N-conduction layer 120. The P-bottom portion doped area 140 is situated between a portion of the bottom N-conduction layer 120 and a portion of Handle wafer 101. That is, the P-bottom portion doped area 140 is formed by implanting ions in an intermediate area that is deeper than the N-conduction layer 120 but within the Handle wafer 101.

In the example of FIG. 1A, the P-top portion doped area 130 acts as a barrier to current that enables a current to flow along the N-conduction layer 120 by means of an offset to compensate for a variety of defects that are potentially present in the Handle wafer 101 surface's non-uniformity and the fabricating process. That is, current passing through the N-conduction layer 120 is induced to flow more below the interface of a surface of Handle wafer 101. Also, the P-bottom portion doped area 140 also forms a structure that governs how the current passes through the N-conduction layer. As a result, the current flows in parallel to the surface of Handle wafer 101, because the P-bottom portion doped area 140 operations in conjunction with the P-top portion doped area 130. Specifically, this structure improves the current flow because the space in which the current is able to pass is formed more narrowly. Regions 130 and 140 can be formed together (same step in the process) simply by selective different energies for the two ion implant steps.

In other words, P-top portion doped area 130 is to push the current flow within the N-sensor layer below the interface between the handle wafer and the buried oxide. The goal of region 140 is to compensate for any "dopant tail" into the substrate which would result in a lower "current density" within the N-sensor layer 120. Having the N-sensor current confined to a narrower space will increase the "current density" in the N-sensor layer.

An analog-digital circuitry 150, hereinafter, referred to as "circuitry," is provided on a top surface of the magnetic sensor 10, which is on top of the SOI layer. The circuitry 150 processes values detected by the magnetic sensor 10. The magnetic field sensing device is substantially configured with respect to the type of information it provides by the manner in which the magnetic sensor 10 and circuitry 150 are combined. Such circuitry 150 is situated in both the SOI layer 104 and Si-Epitaxial Layer 106 or in the Si-Epitaxial Layer 106 alone, with a Buried Oxide 102 sandwiched in between. Thus, the circuitry 150 is positioned at a top portion of the magnetic field sensing device. Low Noise Amplifier senses the voltage generated within the Sensor, the AGC block amplifies the signal and the ADC converts the signal to a digitized output signal. In the circuitry 150, Low Noise Amplifier senses the voltage generated within the Sensor, the AGC block amplifies the signal and the ADC converts the signal to a digitized output signal.

To enable a connection of the magnetic sensor 10 and the circuitry 150, a first deep trench contact 160 and a second deep trench contact 162 are provided. The first deep trench contact 160 and the second deep trench contact 162 are each also called a "sensor contact." The sensor contacts are formed by passing through the buried oxide 102. That is, the first deep trench contact 160 and the second deep trench contact 162 that each correspond to a sensor contact, pass through the buried oxide 102, SOI layer 104, and Epitaxial Layer 106. Also, the sensor contacts 160, 162 are connected with a metal interconnction 111 that is positioned in the intermetal dielectric 110, and extends to the sensing area 190. This design therefore provides sensor contacts that interconnect an N-doped area of a high concentration 122 formed on the N-conduction layer 120.

To this end, a conductor is placed so as to fill the inside of a first deep trench contact 160 and a second deep trench contact 162. Examples of conductors used as the filling material are Tungsten (W) with Titanium (Ti) metals and Titanium nitride layer (TiN). Typically, the Ti is formed to create a low resistance interface, TiN is formed first as a barrier, and the W is used as a low resistance fill inside the trench, in that order. However, these are only examples and other conducting materials are used in other examples. Here, in the intermetal dielectric layer 110, VIAS are also formed, which is electrically connected with the circuitry 150 by the metal wire 111.

In addition to the first deep trench contact 160 and the second deep trench contact 162, a third deep trench contact 164 is formed. The third deep trench contact 164 connects a bonding pad 113 provided in the passivation layer 112 and Handle wafer 101. Here, the bonding pad 113 is provided to facilitate electrical combination with other external constituents. The third deep trench contact 164 is used to provide a ground of the magnetic sensor 10. Thus, the third deep contact 164 acts as a ground contact.

An SOI layer 104 and a Si-Epitaxial layer 106 around the first deep trench contact 160 and the second deep trench contact 162 are formed within an isolation 170 that is filled with an insulating material. The isolation 170 is provided for preventing the circuitry 150 and sensor contact from being coupled electrically to each other. Here, the isolation 170 is formed by a trench process by which, after etching the SOI layer 104 and Si-Epitaxial Layer 106, the insulating material is then filled into the isolation. That is, after most of the thickness of the circuitry 150 is formed, it is appropriate to form the isolation 170 into the SOI layer 104 and Si-Epitaxial Layer 106 to isolate the circuitry 150 and the second contact from one another as discussed above. Other isolation approaches are possible such as STI (if the 104 and 106 are thin enough) or junction isolation.

FIG. 1B is an example view of a plan view regarding circuitry 150 that is formed on a magnetic sensor.

As shown in FIG. 1B, there are formed four sensor contacts 160, 161, 162, 163. There is an isolation area 170 that surrounds each of the sensor contacts 160, 161, 162, 163. The four sensor contacts 160, 161, 162, 163 are electrically connected with the circuitry 150. As shown in FIG. 1A, a sensor contact is connected with a metal interconnect 111 to the circuitry 150. Among the four sensor contacts 160, 161, 162, 163, two of the sensor contacts detect a voltage change due to a Hall effect. The other two sensor contacts are used to detect the amount of current. Thus, four sensor contacts 160, 161, 162, 163 are disposed at corners of N-doped area 120, and the four sensor contacts 160, 161, 162, 163 are in electrical contact with the N-doped area 120 of the sensing area 190. The other ground contacts 164 are used to provide a ground for the Handle wafer of the semiconductor. Sensor can be configured such that the applied current flows from 161 to 163 or 163 to 161, and the voltage is sensed on the other two terminals 162 and 170. Or, current can flow from 162 to 170 or 170 to 162 and the voltage can be sensed between 161 and 163.

In this manner, the first example provides, while forming a magnetic field sensing device in a Handle wafer 101 that constitutes an SOI substrate 100 and circuitry 150 to be isolated at a top portion of the Handle wafer 101. Therefore, it is possible to realize independently a magnetic sensor having an optimal area. Meaning that the area can be as large as the size of the entire device on FIG. 1B. Since it is possible to realize the optimized sensor area independently, such a sensor is not generated so as to intentionally reduce the size of semiconductor chip or semiconductor die. Moreover, the magnetic sensor 10 and the circuitry 150 are formed on different layers from each other, such that the magnetic sensor 10 and the circuitry potentially optimize respective doping profiles independently. Such optimization is possible because the sensing device is formed apart from the circuitry 150. Also, another feature of the example is its ability to detect more sensitively the magnetic field of the earth that flows beneath the substrate.

This disclosure now further discusses other examples. In explaining the examples, it is to be noted that an identical configuration to prior examples are given the same reference numeral or the explanations thereof are omitted for brevity.

Figure 2:
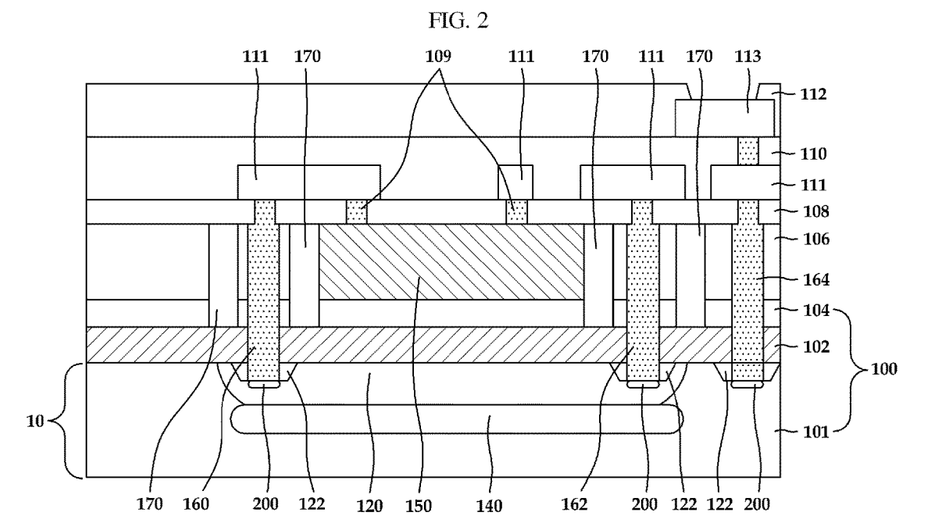
FIGS. 2 to 9 depict cross-sectional views of a semiconductor device comprising a magnetic sensor in accordance with other examples.

FIG. 2 is a cross-sectional view of a semiconductor device comprising a magnetic sensor in accordance with the second example of the present disclosure. The second example is described, with respect to differences from the first embodiment.

Referring to FIG. 2, the laminated structure is identical to FIG. 1. That is, there are a Handle wafer 101, a buried oxide 102, a SOI layer 104 that are parts of an SOI substrate 100 having a thick SOI layer. A Si-Epitaxial layer 106 is selectively formed on the SOI layer 104; an inter layer dielectric 108, an intermetal dielectric 110 and a passivation layer 112 are formed upon the Si-Epitaxial layer 106, in regular sequence.

To form a sensing area, an N-conduction layer 120 formed of an N-doped area of a high concentration 122 is provided in the Handle wafer 101. The P-bottom portion doped area 140 as an optional layer is situated beneath a bottom portion of the N-conduction layer 120.

Also, circuitry 150 is provided at a top portion of N-conduction layer 120, situated in the SOI layer 104 and Si-Epitaxial layer 106. In FIG. 2, P-bottom portion doped area 140 is co-implanted with N-conduction layer 120, meaning that they are formed at the same time by using different ion implants.

Further, to provide contact to the sensing area, a ground contact for a sensor contact and a ground are formed. This provision of contact is possible by forming the first deep trench isolation, second deep trench isolation, and the third deep trench contact 160, 162, 164. Around the first deep trench contact 160 and the second deep trench contact 162, an isolation 170 is formed. Here, the first deep trench contact 160, second deep trench contact 162, and the third deep trench contact 164 are formed over the buried oxide 102, SOI layer 104, Si-Epitaxial layer 106 and the inter layer dielectric 108. The isolation 170 is formed over the SOI layer 104 and the Si-Epitaxial layer 106. In other words, the sensor contacts 160, 162 are formed by passing through the buried oxide 102. Further, the first deep trench contact 160 and the second deep trench contact 162 that correspond to sensor contacts pass through the buried oxide 102, SOI layer 104 and Epitaxial layer 106. Also, the sensor contacts 160, 162 are connected with the metal interconection 111 that is positioned in the intermetal dielectric 110, and the metal wire 111 reaches to the sensing area 190.

There are differences between a magnetic sensor in the second example and a magnetic sensor in the first embodiment. First, a P-bottom portion doped area 140 is formed only at the bottom portion of N-conduction layer 120. The P-bottom portion doped area 140 is for providing a current is able to pass between electrodes, and the P-bottom portion doped area 140 provides that a current passes so that a current flows in parallel to the surface of Handle wafer 101. That is, the diffusion of current toward a bottom of a N-conduction layer 120 is prevented. Such a P-bottom portion doped area 140 is formed in an area deeper than the N-conduction layer 120 that is an N-doped area formed, by a doping process, from the Handle wafer 101.

Meanwhile, a length of the P-bottom portion doped area 140 becomes longer compared to the P-bottom portion doped area in the first example. Thus, in the second example, the length of P-bottom portion doped area 140 is approximately identical to or longer than that of N-conduction layer 120. Once lengths of N-conduction layer 120 and P-bottom portion doped area 140 are formed to be identical, during fabricating the semiconductor device it is possible to reduce not only the reduce the number of masks that are used in the doping process, but also generally facilitate the fabricating process. Namely, the N-conduction layer 120 and the P-bottom portion doped area 140 are formed by a doping process referred to as co-implantation. In the first example, the N-conduction layer is different in lengths of the P-top portion doped area and P-bottom portion doped area, such that doping masks different from each other needed to be used. In contrast, in the second example, a semiconductor device is fabricated using one mask. Compared to the first example, a semiconductor device is fabricated using a smaller number of masks.

However, also in the second example, the P-Top portion is skipped as an optional feature. In other words, region 130 could be formed in FIG. 2 but it is omitted.

Also, in the second example, bottom portions of the first deep trench isolation, the second deep trench isolation, and the third deep trench contact 160, 162, 164 are formed inside the Handle wafer 101, not on the surface of the Handle wafer 101. Thus, a trench area is formed on the surface of Handle wafer 101 with a certain depth. Additionally, at the ends of the first deep trench contact, the second deep trench contact, and the third deep trench contact 160, 162, 164, a P-doped area of a high concentration 200 is formed. If the P-doped area of high concentration 200 is formed as discussed, the performance is potentially enhanced given in such an example, noise of magnetic sensor is reduced. The main point of FIG. 2 is to show an embodiment with "self-aligned contacts". Both contacts to N type regions, 160 and 162, can be formed at the same time as contacts to P-type region, 164. The bottom side of the deep trench contacts 160 162 164 connect to N type doped area 122, while the bottom of deep trench contacts 160 162 164 contact to P type doped area 200. "Self-Aligned Contacts" is formed by etching the deep trenches to a depth close to the TOP of the handle wafer 101. Then, implanting N-dopants to a high concentration and followed by annealing the implanted N-dopants are performed to form a sideways diffusion 122. Then further etching the deep trench to penetrate through the N+ region, then implanting P-dopants to a high concentration is performed to form region 200.

Figure 3:
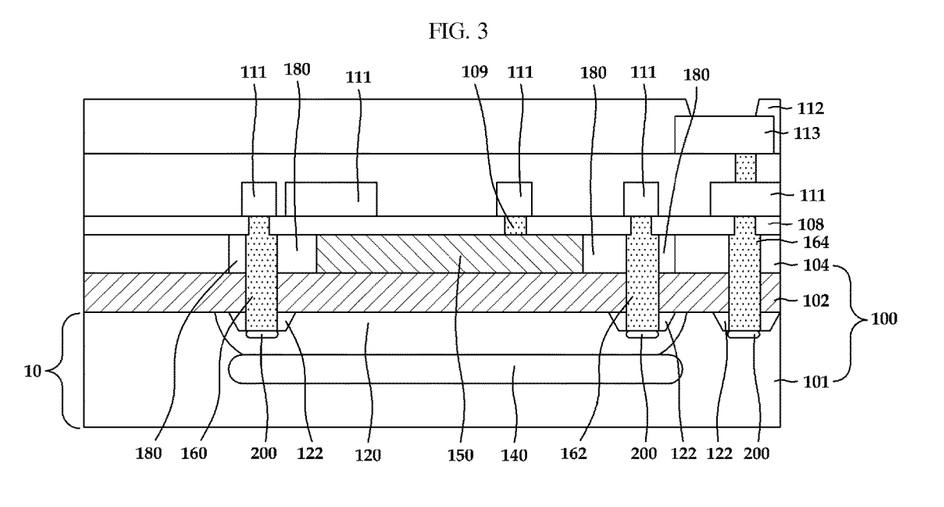

FIG. 3 is a cross-sectional view of a semiconductor device comprising a in accordance with a third example.

In the third example, like the first and the second examples described above, a semiconductor device based on an SOI substrate is disclosed. Unlike the foregoing examples, the third example shows a thicker epi layer is not necessary. For simplicity, FIG. 3 approach is similar to FIG. 2 approach, with the Epi layer omitted. Optional 130 layer could also be implemented.

Referring to FIG. 3, to form a sensing area, the N-conduction layer 120 is formed in the Handle wafer 101. The P-bottom portion doped area 140 is situated on a bottom surface of the N-conduction layer 120. In the third example, lengths of the P-bottom portion doped area 140 and the bottom surface of the N-conduction layer 120 are similar. Also, in the N-conduction layer 120, an N-doped area of a high concentration 122 that is in contact with the first deep trench contact 160 and the second deep trench contact 162 is formed. A P-doped area of a high concentration 200 is formed under the N-doped area of high concentration 122. Also, a third trench area 164 is formed, which connects a bond pad 113 provided in a partially etched portion of a passivation layer 112 and the Handle wafer 101. Also at the one end corresponding to the third trench area 164, an N-doped area of a high concentration 122 and a P-doped area of a high concentration 200 are formed.

In regards to differences with the previous examples, in the third example, the Si-Epitaxial layer present in the previous examples is not formed on the SOI layer 104 that constitutes the SOI substrate 100. That is to say, in the first and the second examples, the Si-Epitaxial layer is additionally formed on the SOI layer. By depositing the additional Si-Epitaxial layer, a thickness of the SOI substrate is thus formed to be thick. However, in the third example, only SOI layer is formed, and hence the thickness of the SOI substrate is thus formed to be relatively less thick.

Like the previous example, the sensor contacts 160, 162 are formed by passing through the buried oxide 102. That is, the first deep trench contact 160 and the second deep trench contact 162 corresponding to the sensor contacts, pass through the buried oxide 102 and the SOI layer 104. Also, the sensor contacts 160, 162 are connected with the metal wire 111 that is positioned in the intermetal dielectric 110, and reaches out to the sensing area 190.

Also, similarly, an inter layer dielectric 108 and an intermetal dielectric 110 are formed on the top of SOI layer 104 as an intermetal dielectric and a passivation layer 112 is formed on the inter layer dielectric 108 and the intermetal dielectric 110.

Also, circuitry 150 is formed on the SOI layer 104. Here, the circuitry 150 has a relatively thin thickness. Thus, the design of the circuitry 150 is optimized for the thickness of the SOI layer 104.

Due to the difference, in the third example, isolation 180 is formed by a different process.

In the third example, the isolation 180 is formed using a process technique of Local Oxidation of Silicon (LOCOS) that is an example of a device isolation structure, where the structure electrically isolates devices when forming the SOI layer 104. Another approach is a process technique of Shallow Trench Isolation (STI). However, LOCOS and STI are only two approaches to providing the isolation 180 in the third example, and other approaches may be used in other aspects of this example. Therefore, the isolation 180 in the third example is first formed on the SOI layer 104 and the first deep trench contact 160 and the second deep trench contact 162 are then formed. For this reason, the isolation 180 is formed in a shape that is in contact with outer surfaces of the first deep trench contact 160 and the second deep trench contact 162, unlike the first and the second examples.

As stated above, in the third embodiment, the SOI layer 104 is formed while implementing a LOCOS process, an STI process, or an appropriate alternative process. The quantity of processing is in turn reduced in comparison with alternative approaches.

Meanwhile, in the third example, it is provided that the P-top portion doped area is able to be further formed on the N-conduction layer 120.

Figure 4:
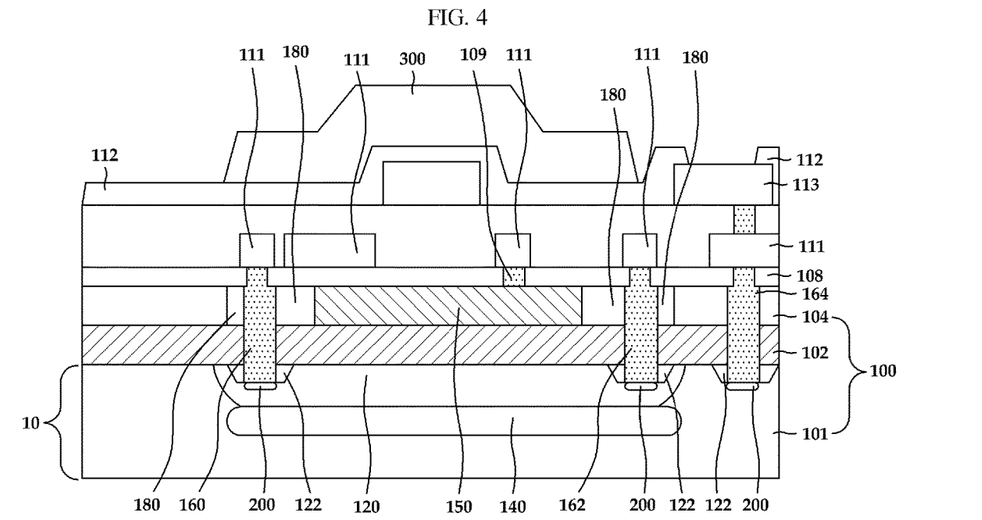

FIG. 4 is a cross-sectional view of a semiconductor device apparatus in accordance with a fourth example.

The fourth example is a semiconductor device fabricated by use of an SOI substrate including a thin SOI layer and an integrated magnetic concentrator (IMC) operating together. Similar to FIG. 3 but IMC is added.

FIG. 4 is similar to the third example shown in FIG. 3. In FIG. 4, an intermetal dielectric, such as an inter layer dielectric 108 and so forth, is formed directly in the SOI layer 104 of the SOI substrate 100.

Further, to form a sensing area, the N-conduction layer 120 is formed as having a certain depth from a surface of the Handle wafer 101 of the SOI substrate 100. On the N-conduction layer 120, the N-doped area of high concentration 122 in contact with one end of the first deep trench contact 160 and the second deep trench contact 162 is formed. Also, the P-doped area of high concentration 200 is formed. Also, at the bottom portion of the N-conduction layer 120, the P-bottom portion doped area 140 is formed, which is optional.

Like the other aforementioned examples, the sensor contacts 160,162 are formed by passing through the buried oxide 102. That is, the first deep trench contact 160 and the second deep trench contact 162 that correspond to the sensor contacts, also pass through the buried oxide 102 and the SOI layer 104. Additionally, the sensor contacts 160, 162 are connected with the metal wire 111 that is positioned in the intermetal dielectric 110, and reaches out to the sensing area 190.

The third deep trench contact 164 connects the bonding pad 113 and the Handle wafer 101. Also in the third deep trench contact 164, one end that is connected with the Handle wafer 101 includes the N-doped area of high concentration 122 and the P-doped area of high concentration 200.

In the fourth example, the circuitry 150 is formed only in the SOI layer 104, and the isolation 180 is formed in the SOI layer 104 to electrically isolate devices from each other. The isolation 180 in the fourth embodiment is formed by a LOCOS process (not shown) or an STI process (shown), for example, so as to electrically isolate devices laterally. The isolation 180 is formed together during the formation of the SOI layer 104.

Meanwhile, in the fourth example, a non-planar or a curved integrated magnetic concentrator (IMC) 300 is further formed on a passivation layer 112 that is formed on the top surface of the inter layer dielectric (ILD) 108 and IMD layers 110. The curved integrated magnetic concentrator 300 is able to curves the magnetic flux lines.

According to the fourth example, the integrated magnetic concentrator 300 has a shape in which a surface shape is uneven and curved. Hence, the passivation layer 112 will be formed of the non-planar or stepped surface with specific respect to the surface that is in contact with the integrated magnetic concentrator 300, like the integrated magnetic concentrator 300 itself. Meanwhile, both ends of the integrated magnetic concentrator 300 are positioned in a location that is approximately similar to a location of the N-conduction layer 120. However, the integrated magnetic concentrator 300 has a curved surface, such that its total length is potentially longer than the N-conduction layer 120.

The integrated magnetic concentrator 300 is formed of a magnetic substance. For example, the magnetic substance may be a ferromagnetic substance that has the capability to be a permanent magnet. In some examples, the magnetic substance consists of alloy containing two or more of Ni, Fe, Co, Mo or Mn. The magnetic substance is to be chosen such that a rate of thermal expansion of the magnetic substance is preferably 5 to 20 ppm/° C. In an aspect of the fourth example, a NiFe alloy is used as the magnetic substance for integrated magnetic concentrator 300.

The fourth example provides a narrow current passage that is horizontal to a surface of the Handle wafer 101 by further forming a P-top portion doped area in the N-doped area 120.

Figure 5:
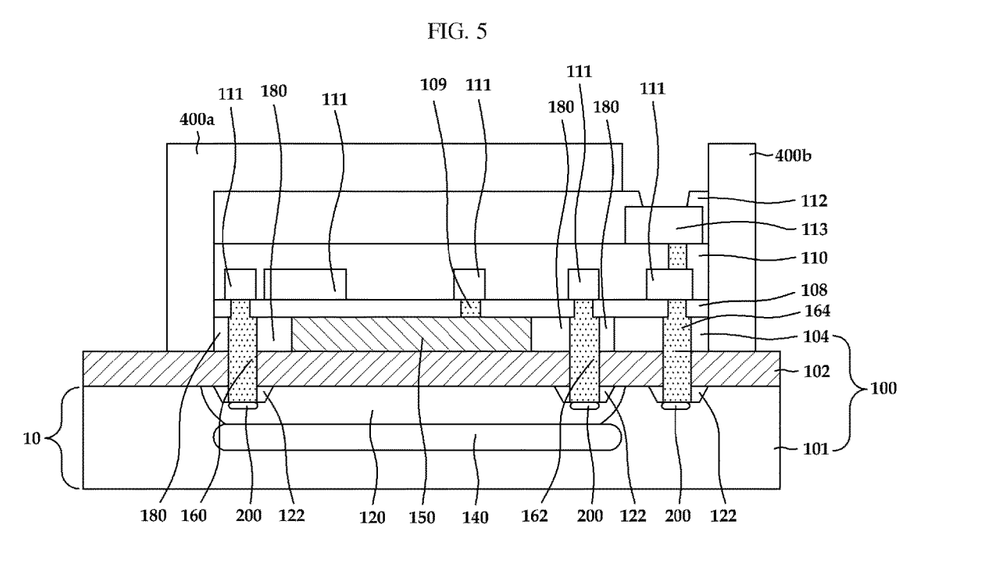

FIG. 5 is a cross-sectional view of a semiconductor device in accordance with a fifth example. Main goal is a structure which has IMC covering the SIDES of the active (analog digital) circuitry. Other details are similar to FIGS. 3 and 4.

The fifth example shown in FIG. 5 is similar in its structure in FIG. 4 in that the fifth example is also based on a thin SOI layer and an integrated magnetic concentrator.

However, there are differences between the fifth example and the fourth example. In the fifth example, the SOI layer 104, the inter layer dielectric 108, the intermetal dielectric 110 and the passivation layer 112 are not formed along the total area of the buried oxide 102, but are instead formed along a part of the area of the buried oxide 102.

A shape of an integrated magnetic concentrator is also different in the fifth example. That is, in an aspect of the fifth example, the integrated magnetic concentrator is divided into a first integrated magnetic concentrator 400a and a second integrated magnetic concentrator 400b with the bonding pad 113 as a center. The first integrated magnetic concentrator 400a has a shape that surrounds a left side of the SOI layer 104, the inter layer dielectric 108, the intermetal dielectric 110 and the passivation layer 112, and a top surface of the passivation layer 112, as shown in FIG. 5. The second integrated magnetic concentrator 400b has a shape that surrounds a right side of the SOI layer 104, the inter layer dielectric 108, the intermetal dielectric 110 and the passivation layer 112. Both the first integrated magnetic concentrator 400a and the second integrated magnetic concentrator 400b have a shape that meet the intermetal dielectrics 108, 110 or passivation layer 112 and that directly contacts the buried oxide 102. However, in another example, the first integrated magnetic concentrator 400a and the second integrated magnetic concentrator 400b are arranged such that the first integrated magnetic concentrator 400a is on the right and the second integrated magnetic concentrator 400b is on the left.

Based on the structures discussed above, it is possible to fabricate an appropriate semiconductor device.

In the fifth example, it is also possible to further form a P-top portion doped area in the N-conduction layer 130.

Figure 6:
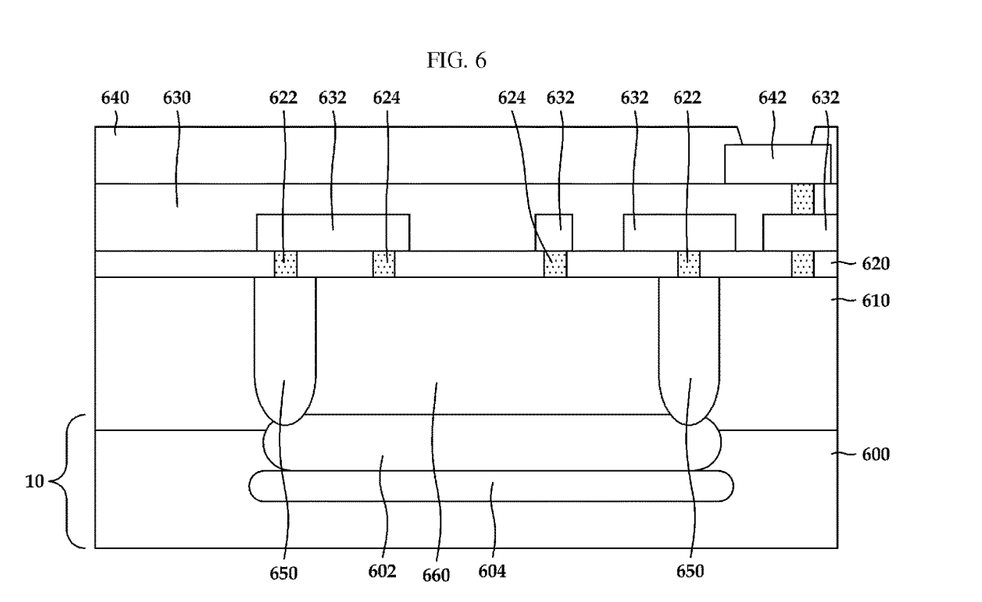

FIG. 6 is a cross-sectional view of a semiconductor device in accordance with a sixth example.

The sixth example relates to a structure in which the SOI substrate used in the foregoing examples is not present. FIG.

6 relates to a NON-SOI implementation and the bottom is a substrate, not a handle wafer since there is no SOL In the sixth example, first a P-type substrate 600 is formed. On the top surface of that P-type substrate 600, a P-type Epitaxial layer 610 is formed. The P-type Epitaxial layer 610 is formed by growing a P-type Epitaxial layer 610 that is approximately similar to a thickness of the P-type substrate 600.

In the sixth example, the N-conduction layer 602 is formed between the P-type substrate 600 and the P-type Epitaxial layer 610 and forms a sensing area formed at the interface of the P-type substrate 600 and P-type epitaxial layers 610. As shown, the N-conduction layer 602 is formed primarily in the P-type substrate 600. Also, the P-bottom portion doped area 604 is formed at the bottom portion of N-conduction layer 602. Here, the N-conduction layer 602 acts as a current passage; and the P-bottom portion doped area 604 induces the current passage to flow along the surface of the P-type substrate 600. P-bottom portion doped area 604 is an optional layer similar to 140 in previously described embodiments. P-bottom portion doped area 604 can be formed in a co-implanted fashion.

As discussed above, the magnetic sensor 10 in the sixth example is formed between the P-type Epitaxial layer 610 and the P-type substrate 600.

In the P-type Epitaxial layer 610, there is formed a sensor contact 650 that is isolated by a certain interval so as to contact the magnetic sensor 10. The sensor contact 650 is formed to be an N-area of a high concentration by an ion implantation process. The sensor contact 650 may also be called a "N Sinker" which is a common term in the industry, referring to a highly doped N-type diffusion to a N-type buried layer.

Circuitry 660 is also provided in the P-type Epitaxial layer 610 between sensor contacts 650. The circuitry 660 is formed on the P-type substrate 600 with an epitaxial layer 610 on top to the substrate 600. The magnetic sensor 10 is formed under the circuitry 660.

Thereafter, an inter layer dielectric 620 and an intermetal dielectric 630 are formed on a top surface of the P-type Epitaxial layer 610. As in the other examples, a passivation layer 640 is formed thereon again. The intermetal dielectric 630 is formed of metal wires 632. Contact plugs 622, 624 are formed in the inter layer dielectric 620 so that a magnetic sensor 10 and circuitry 660 are connected through the metal wires 632.

As discussed above, the sixth example forms a magnetic sensor 10 at the interface of a P-type substrate 600 and a P-type Epitaxial layer 610.

Figure 7:
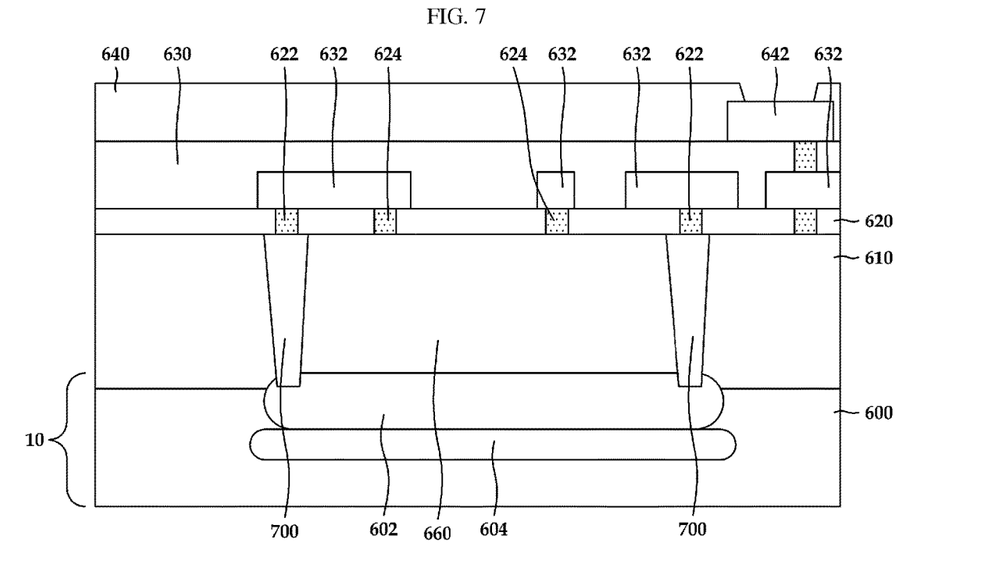

FIG. 7 is a cross-sectional view of a semiconductor device in accordance with a seventh example of the present disclosure.

The seventh example relates to a NON-SOI implementation. Nevertheless, there is a difference between the seventh example and the sixth example in that a sensor contact 700 formed on a P-type Epitaxial layer 610 in the seventh example is formed through a trench process.

In the seventh example, the sensor contact 700 is formed of a trench area from a surface of a P-type Epitaxial layer 610 to an N-conduction layer 602. In the trench area formed as above, polysilicon that is doped with an N-type dopant at a high concentration is used to perform the filling.

Figure 8:
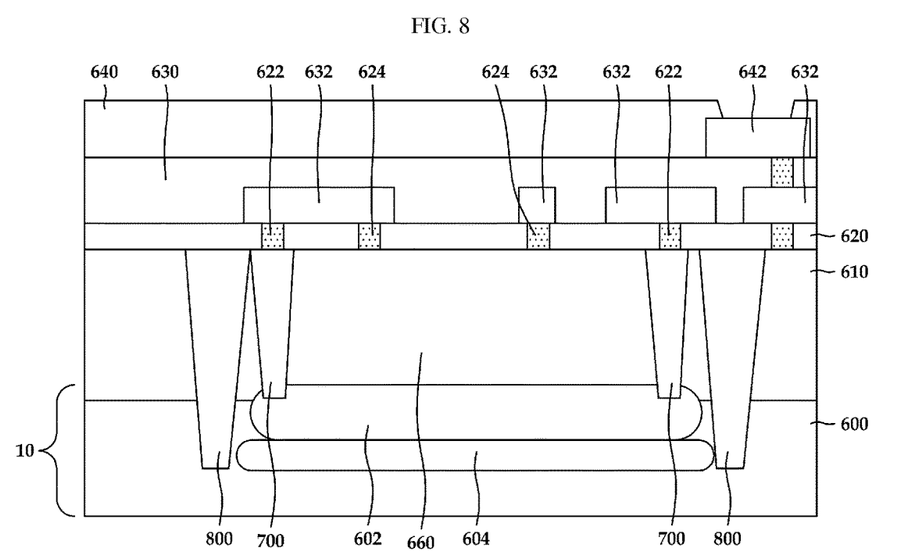

FIG. 8 is a cross-sectional view of a semiconductor device in accordance with an eighth example.

The eighth example further enhances the performance when performing the isolation of the magnetic sensor 10 shown in FIG. 7. Also, the structure of the eighth example is such that it does not use the SOI substrate.

That is to say, in the eighth example, as shown in FIG. 8, a deep trench isolation (DTI) 800 is formed at one side of the sensor contact 700 filled with an N-polysilicon of a high concentration. Here, the deep trench isolation (DTI) 800 is formed from a surface of the P-type Epitaxial layer 610 to a bottom surface of the P-bottom portion doped area 604.

Figure 9:
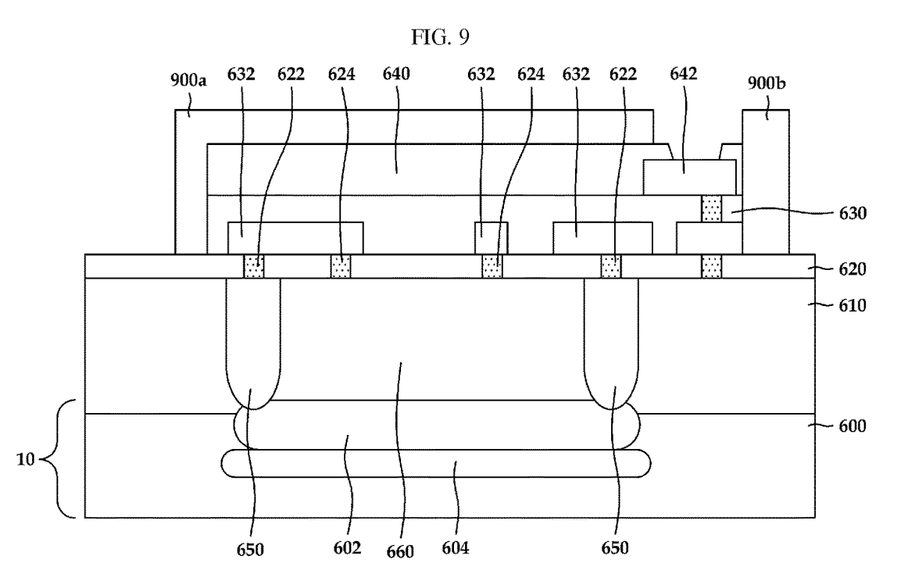

In the deep trench isolation 800 formed as above, one of an oxide, air or polysilicon and silicon oxide liner is filled into the deep trench and serves as an insulating material. However, other insulating material are used in other examples and these are merely possible insulators, FIG. 9 is a cross-sectional view of a semiconductor device in accordance with a ninth example. The structure of FIG. 9 is also such that it does not use a SOI substrate.

FIG. 9 is an example in which a magnetic sensor 10 is formed between a P-type Epitaxial layer 610 and a P-type substrate 600. This example is similar to FIG. 6 but with IMC. A P-type Epitaxial layer 610 is formed on the top of the P-type substrate 600. Additionally, an inter layer dielectric 620 is formed on the top of the P-type Epitaxial layer 610. Further, on the top of the inter layer dielectric 620, an intermetal dielectric 630 and a passivation layer 640 are formed. These layers 630, 640 are laminated onto and partially cover only a portion of the inter layer dielectric 620.

Also, between sensor contacts 650 formed in the P-type Epitaxial layer 610, circuitry 660 is provided.

Furthermore, also in FIG. 9, an integrated magnetic concentrator 900 is provided. However, the surface of integrated magnetic concentrator 900 is formed as having an even sure. In the ninth example, the integrated magnetic concentrator 900 is divided into a first integrated magnetic concentrator 900a and a second integrated magnetic concentrator 900b, with the bonding pad 642 being their center. In view of FIG. 9, the first integrated magnetic concentrator 900a has a shape that surrounds left sides of the intermetal dielectric 630 and the passivation layer 640, and a top surface of the passivation layer 640. The second integrated magnetic concentrator 900b is a shape that surrounds right sides of the intermetal dielectric 630 and the passivation layer 640. Thus, both the first integrated magnetic concentrator 900a and the second integrated magnetic concentrator 900b have shape that meet the intermetal dielectric 630 or passivation layer 640, and that directly contacts the inter layer dielectric 620.

Based on the above structure, it is possible to fabricate a semiconductor device.

As explained above, the subject matter of this disclosure is a way forming a semiconductor device comprising a magnetic sensor which located under an analog-digital circuits and improving such a structure so as to position the analog-digital circuits used for processing magnetic field data on the magnetic sensor, thereby providing a magnetic sensor capable of detecting a magnetic field with sensitivity while minimizing an area of the semiconductor device or magnetic sensor as much as possible.

In this manner, a sensor area is optimized. Hence, an effect of not enlarging the semiconductor chip or the semiconductor die size unduly is achieved. Moreover, the doping profile for semiconductor layer that is used in a magnetic sensor as provided in examples can be controlled independently. Such a separate doping profile for a magnetic sensor is possible because is the sensor is formed separately from the circuitry. Also, it is possible to more sensitively detect the magnetic field of the earth that flows beneath the substrate.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A semiconductor device comprising:
a circuitry formed on a silicon substrate; and
a magnetic sensor having a sensing area formed under the circuitry,
wherein the sensing area comprises an N-doped area and a P-doped area doped deeper than the N-doped area, and sensor contacts connect the sensing area to the circuitry, and
wherein the P-doped area is discretely formed in the silicon substrate and has a higher doping concentration than that of the silicon substrate, and the P-doped area is different from the silicon substrate.

2. The semiconductor device of claim 1, wherein two or more of the sensor contacts receive a voltage change due to a Hall effect and the other sensor contacts receive a corresponding amount of current.

3. The semiconductor device of claim 1, wherein one of the sensor contacts acts as a ground.

4. The semiconductor device of claim 1, wherein the N-doped area comprises an area of a high concentration of dopant and the N-doped area is connected to the circuitry at the area of the high concentration of dopant.

5. The semiconductor device of claim 1, wherein current flows through the N-doped area and the P-doped area acts as a barrier that guides how current flows through the N-doped area.

6. The semiconductor device of claim 1, wherein the P-doped area is disposed outside of the N-doped area.

7. The semiconductor device of claim 1, wherein an upper-most surface of the P-doped area is disposed under an upper-most surface of the N-doped area.

8. The semiconductor device of claim 1, further comprising a highly P-doped area disposed in the N-doped area, wherein the highly P-doped area has a greater ion concentration than the P-doped area.

9. The semiconductor device of claim 8, wherein the highly P-doped area is disposed between at least one of the sensor contacts and the P-doped area.

10. The semiconductor device of claim 1, wherein the N-doped area and the P-doped area of the sensing area are entirely contained within the substrate.

11. A semiconductor device, comprising:
a silicon on insulator (SOI) substrate comprising a silicon substrate, a buried oxide, and an SOI layer;
a circuitry formed on the buried oxide; and
a magnetic sensor having a sensing area formed under the buried oxide,
wherein the sensing area comprises an N-doped area and a P-doped area doped deeper than the N-doped area, and sensor contacts connect the sensing area with the circuitry through the buried oxide.

12. The semiconductor device of claim 11, wherein the P-doped area has a higher doping concentration than that of the silicon substrate.

13. A semiconductor device comprising:
a circuitry formed on a silicon substrate;
a magnetic sensor having a sensing area formed under the circuitry, wherein the sensing area comprises an N-doped area and a P-doped area doped deeper than the N-doped area, and sensor contacts connect the sensing area to the circuitry;
an intermetal dielectric formed on the sensor contacts; and
an integrated magnetic concentrator (IMC) formed on the intermetal dielectric,
wherein the P-doped area is formed in the silicon substrate and has a higher doping concentration than that of the silicon substrate.

* * * * *